(12) United States Patent
Khlat et al.

(10) Patent No.: US 8,626,091 B2
(45) Date of Patent: Jan. 7, 2014

(54) ENVELOPE TRACKING WITH VARIABLE COMPRESSION

(75) Inventors: Nadim Khlat, Cugnaux (FR); Andrew F. Folkmann, Cedar Rapids, IA (US); James M. Retz, Cedar Rapids, IA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/550,060

(22) Filed: Jul. 16, 2012

(65) Prior Publication Data
US 2013/0181774 A1    Jul. 18, 2013

Related U.S. Application Data

(60) Provisional application No. 61/508,230, filed on Jul. 15, 2011.

(51) Int. Cl.
*H04B 1/04* (2006.01)
(52) U.S. Cl.
USPC .................................. 455/115.1; 455/127.1
(58) Field of Classification Search
USPC ............ 455/91, 114.1, 114.2, 115.1, 126, 455/127.1, 127.2, 127.4; 375/295, 296, 375/297; 330/127, 129, 149
See application file for complete search history.

(56) References Cited

U.S. PATENT DOCUMENTS

| | | |
|---|---|---|
| 4,996,500 A | 2/1991 | Larson et al. |
| 5,311,309 A | 5/1994 | Ersoz et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,581,454 A | 12/1996 | Collins |
| 5,646,621 A | 7/1997 | Cabler et al. |
| 5,715,526 A | 2/1998 | Weaver, Jr. et al. |
| 5,822,318 A | 10/1998 | Tiedemann, Jr. et al. |
| 5,898,342 A | 4/1999 | Bell |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

International Preliminary Report on Patentability for PCT/US2011/044857 mailed Mar. 7, 2013, 6 pages.

(Continued)

*Primary Examiner* — Thanh Le
(74) *Attorney, Agent, or Firm* — Withrow & Terranova, P.L.L.C.

(57) ABSTRACT

Radio frequency (RF) transmitter circuitry, which includes an envelope tracking power supply and an RF power amplifier (PA), is disclosed. The RF PA operates in either a first operating mode or a second operating mode, such that selection of the operating mode is based on compression tolerance criteria. During the first operating mode, the RF PA receives and amplifies an RF input signal using a first compression level. During the second operating mode, the RF PA receives and amplifies the RF input signal using a second compression level, which is greater than the first compression level. The envelope tracking power supply provides an envelope power supply signal to the RF PA. The envelope power supply signal provides power for amplification.

25 Claims, 6 Drawing Sheets

(56) References Cited

U.S. PATENT DOCUMENTS

| | | |
|---|---|---|
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,348,780 B1 | 2/2002 | Grant |
| 6,559,689 B1 | 5/2003 | Clark |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,728,163 B2 | 4/2004 | Gomm et al. |
| 6,819,938 B2 | 11/2004 | Sahota |
| 6,995,995 B2 | 2/2006 | Zeng et al. |
| 7,058,373 B2 | 6/2006 | Grigore |
| 7,164,893 B2 * | 1/2007 | Leizerovich et al. ...... 455/127.1 |
| 7,233,130 B1 | 6/2007 | Kay |
| 7,411,316 B2 | 8/2008 | Pai |
| 7,528,807 B2 | 5/2009 | Kim et al. |
| 7,529,523 B1 | 5/2009 | Young et al. |
| 7,539,466 B2 * | 5/2009 | Tan et al. ................... 455/127.1 |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,696,735 B2 | 4/2010 | Oraw et al. |
| 7,773,691 B2 | 8/2010 | Khlat et al. |
| 7,777,459 B2 | 8/2010 | Williams |
| 7,782,036 B1 | 8/2010 | Wong et al. |
| 7,805,115 B1 | 9/2010 | McMorrow et al. |
| 7,859,336 B2 | 12/2010 | Markowski et al. |
| 7,907,010 B2 | 3/2011 | Wendt et al. |
| 7,994,864 B2 | 8/2011 | Chen et al. |
| 8,000,117 B2 | 8/2011 | Petricek |
| 8,008,970 B1 | 8/2011 | Homol et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,164,388 B2 | 4/2012 | Iwamatsu |
| 8,174,313 B2 | 5/2012 | Vice |
| 8,198,941 B2 | 6/2012 | Lesso |
| 2002/0071497 A1 | 6/2002 | Bengtsson et al. |
| 2003/0017286 A1 | 1/2003 | Williams et al. |
| 2003/0031271 A1 * | 2/2003 | Bozeki et al. ................. 375/297 |
| 2003/0062950 A1 | 4/2003 | Hamada et al. |
| 2003/0137286 A1 | 7/2003 | Kimball et al. |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0124913 A1 | 7/2004 | Midya et al. |
| 2004/0196095 A1 | 10/2004 | Nonaka |
| 2004/0219891 A1 | 11/2004 | Hadjichristos |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0122171 A1 | 6/2005 | Miki et al. |
| 2005/0156662 A1 | 7/2005 | Raghupathy et al. |
| 2005/0157778 A1 | 7/2005 | Trachewsky et al. |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0244513 A1 | 11/2006 | Yen et al. |
| 2007/0014382 A1 | 1/2007 | Shakeshaft et al. |
| 2007/0024360 A1 | 2/2007 | Markowski |
| 2007/0183532 A1 | 8/2007 | Matero |
| 2007/0259628 A1 | 11/2007 | Carmel et al. |
| 2008/0044041 A1 | 2/2008 | Tucker et al. |
| 2008/0081572 A1 | 4/2008 | Rofougaran |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0167260 A1 | 7/2009 | Pauritsch et al. |
| 2009/0174466 A1 | 7/2009 | Hsieh et al. |
| 2009/0190699 A1 | 7/2009 | Kazakevich et al. |
| 2009/0218995 A1 | 9/2009 | Ahn |
| 2009/0289720 A1 | 11/2009 | Takinami et al. |
| 2009/0319065 A1 | 12/2009 | Risbo |
| 2010/0017553 A1 | 1/2010 | Laurencin et al. |
| 2010/0171553 A1 | 7/2010 | Okubo et al. |
| 2010/0301947 A1 | 12/2010 | Fujioka et al. |
| 2010/0308654 A1 | 12/2010 | Chen |
| 2010/0311365 A1 * | 12/2010 | Vinayak et al. ............ 455/127.1 |
| 2010/0321127 A1 | 12/2010 | Watanabe et al. |
| 2011/0018626 A1 | 1/2011 | Kojima |
| 2011/0084760 A1 | 4/2011 | Guo et al. |
| 2011/0148375 A1 | 6/2011 | Tsuji |
| 2011/0235827 A1 | 9/2011 | Lesso et al. |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0170334 A1 | 7/2012 | Menegoli et al. |
| 2012/0176196 A1 | 7/2012 | Khlat |
| 2012/0236444 A1 | 9/2012 | Srivastava et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| GB | 2462204 A | 2/2010 |
| GB | 2465552 A | 5/2010 |
| WO | 0048306 A1 | 8/2000 |
| WO | 04002006 A1 | 12/2003 |
| WO | 2004082135 A2 | 9/2004 |
| WO | 2005013084 A2 | 2/2005 |
| WO | 2006073208 A1 | 7/2006 |

OTHER PUBLICATIONS

Notice of Allowance for U.S. Appl. No. 13/218,400 mailed Apr. 11, 2013, 7 pages.

Non-Final Office Action for U.S. Appl. No. 13/297,470 mailed May 8, 2013, 15 pages.

Notice of Allowance for U.S. Appl. No. 13/222,453 mailed Feb. 21, 2013, 7 pages.

Final Office Action for U.S. Appl. No. 13/222,484 mailed Apr. 10, 2013, 10 pages.

International Search Report and Written Opinion for PCT/US2012/053654 mailed Feb. 15, 2013, 11 pages.

International Search Report and Written Opinion for PCT/US2012/067230 mailed Feb. 21, 2013, 10 pages.

Dixon, N., "Standardization boosts momentum for Envelope tracking," Microwave Engineers, Europe, Apr. 20, 2011, 2 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.

(56) References Cited

OTHER PUBLICATIONS

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Knutson, P, et al., "An Optimal Approach To Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Sahu, B. et al., "Adaptive Power Management of Linear RF Power Amplifier in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
International Preliminary Report on Patentability for PCT/US11/49243 mailed Nov. 13, 2012, 33 pages.
Non-final Office Action for U.S. Appl. No. 13/089,917 mailed Nov. 23, 2012, 6 pages.
Non-final Office Action for U.S. Appl. No. 13/222,453 mailed Dec. 6, 2012, 13 pages.
International Preliminary Report on Patentability for PCT/US2011/033037 mailed Oct. 23, 2012, 7 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024, mailed Feb. 5, 2013, 8 pages.
International Search Report and Written Opinion for PCT/US2012/062070, mailed Jan. 21, 2013, 12 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.

* cited by examiner

ENVELOPE TRACKING WITH VARIABLE COMPRESSION

RELATED APPLICATIONS

This application claims the benefit of U.S. provisional patent application No. 61/508,230, filed Jul. 15, 2011, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and meets performance requirements.

SUMMARY

Embodiments of the present disclosure relate to RF transmitter circuitry, which includes an envelope tracking power supply and an RF power amplifier (PA). The RF PA operates in either a first operating mode or a second operating mode, such that selection of the operating mode is based on compression tolerance criteria. During the first operating mode, the RF PA receives and amplifies an RF input signal using a first compression level. During the second operating mode, the RF PA receives and amplifies the RF input signal using a second compression level, which is greater than the first compression level. The envelope tracking power supply provides an envelope power supply signal to the RF PA. The envelope power supply signal provides power for amplification.

In one embodiment of the RF transmitter circuitry, efficiency of the RF PA is greater when using the second compression level than when using the first compression level. Therefore, the efficiency of the RF PA is greater during the second operating mode than during the first operating mode. Further, the RF PA receives and amplifies the RF input signal to provide an RF transmit signal to RF front-end circuitry using the envelope power supply signal. However, spectrum degradation of the RF transmit signal may be greater when using the second compression level than when using the first compression level. As such, spectrum degradation of the RF transmit signal may be greater during the second operating mode than during the first operating mode. In this regard, the compression tolerance criteria may be based on operating using acceptable levels of spectrum degradation of the RF transmit signal. Therefore, in an exemplary embodiment of the RF transmitter circuitry, the second operating mode is selected to increase efficiency when the spectrum degradation remains within acceptable limits.

In a first exemplary embodiment of the RF transmitter circuitry, the RF front-end circuitry provides an RF receive signal. An RF duplex frequency is equal to a difference between an RF carrier frequency of the RF transmit signal and an RF carrier frequency of the RF receive signal. The compression tolerance criteria includes the RF duplex frequency. The RF duplex frequency represents a frequency separation between the RF transmit signal and the RF receive signal. The greater the RF duplex frequency, the greater the frequency separation between the RF transmit signal and the RF receive signal. Therefore, as the RF duplex frequency increases, interference of the RF receive signal from the RF transmit signal tends to decrease. A duplex threshold is a value of the RF duplex frequency, such that when the RF duplex frequency is above the duplex threshold, the second compression level may be used without undue interference of the RF receive signal from the RF transmit signal. In this regard, the first operating mode is selected when the RF duplex frequency is less than the duplex threshold and the second operating mode is selected when the RF duplex frequency is greater than the duplex threshold.

In a second exemplary embodiment of the RF transmitter circuitry, the envelope power supply signal tracks an envelope of the RF input signal. By tracking the envelope of the RF input signal, an efficiency of the RF transmitter circuitry is greater than if the envelope power supply signal was held at a constant magnitude. In this regard, the envelope power supply signal has an envelope power supply signal bandwidth, which corresponds to a bandwidth of the envelope of the RF input signal. As the envelope power supply signal bandwidth increases, the ability of the envelope tracking power supply to track the envelope of the RF input signal may decrease due to shortcomings in the envelope tracking power supply. Such shortcomings may be due to switching ripple of the envelope tracking power supply; frequency distortion of the envelope tracking power supply due to group delay variations, limited bandwidth of the envelope tracking power supply, or both; modulated output current of the RF PA mixing with an output impedance of the envelope tracking power supply, or any combination thereof.

In this regard, the compression tolerance criteria includes the envelope power supply signal bandwidth. A bandwidth threshold is a value of the envelope power supply signal bandwidth, such that when the envelope power supply signal bandwidth is less than the bandwidth threshold, the second compression level may be used without causing unacceptable levels of spectrum degradation of the RF transmit signal. In this regard, the first operating mode is selected when the envelope power supply signal bandwidth is greater than the bandwidth threshold and the second operating mode is selected when the envelope power supply signal bandwidth is less than the bandwidth threshold. In a first exemplary embodiment of the bandwidth threshold, the bandwidth threshold is equal to about 5 megahertz. In a second exemplary embodiment of the bandwidth threshold, the bandwidth threshold is equal to about 10 megahertz. In a third exemplary embodiment of the bandwidth threshold, the bandwidth threshold is equal to about 15 megahertz.

In a third exemplary embodiment of the RF transmitter circuitry, the compression tolerance criteria includes both the envelope power supply signal bandwidth and the RF duplex frequency. In this regard, the first operating mode is selected when the envelope power supply signal bandwidth is greater than the bandwidth threshold, the RF duplex frequency is less than the duplex threshold, or both, otherwise the second operating mode is selected.

In one embodiment of the RF transmitter circuitry, the RF PA operates in one of multiple operating modes. The multiple operating modes include the first operating mode and the second operating mode. During the one of the multiple operating modes, the RF PA receives and amplifies the RF input signal using a corresponding one of multiple compression levels. The multiple compression levels include the first compression level and the second compression level. Selection of the one of the multiple operating modes is based on the compression tolerance criteria.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
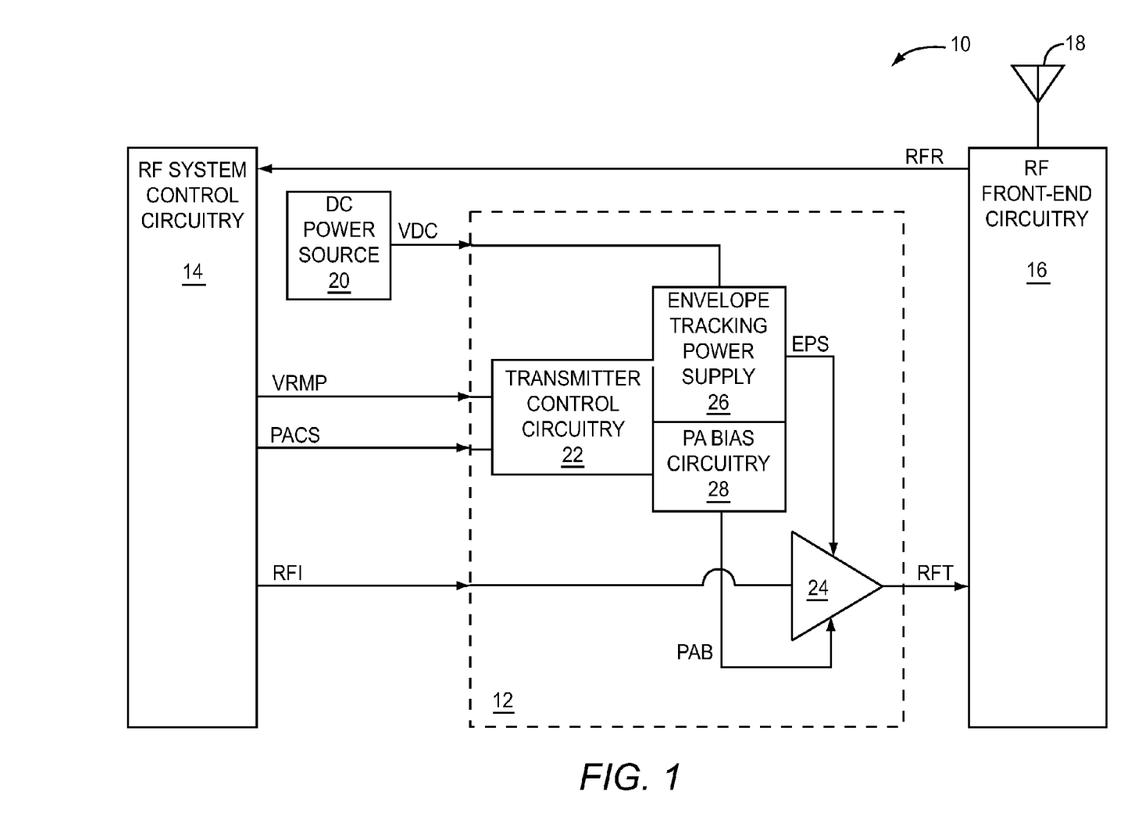
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF transmitter circuitry 12, the RF PA 24 operates in either a first operating mode or a second operating mode, such that selection of the operating mode is based on compression tolerance criteria. During the first operating mode, the RF PA 24 receives and amplifies the RF input signal RFI using a first compression level. During the second operating mode, the RF PA 24 receives and amplifies the RF input signal RFI using a second compression level, which is greater than the first compression level. The envelope tracking power supply 26 provides the envelope power supply signal EPS to the RF PA 24. The envelope power supply signal EPS provides power for amplification.

In one embodiment of the RF transmitter circuitry 12, efficiency of the RF PA 24 is greater when using the second compression level than when using the first compression level. Therefore, the efficiency of the RF PA 24 is greater during the second operating mode than during the first operating mode. Further, the RF PA 24 receives and amplifies the RF input signal RFI to provide the RF transmit signal RFT to the RF front-end circuitry 16 using the envelope power supply signal EPS. However, spectrum degradation of the RF transmit signal RFT may be greater when using the second compression level than when using the first compression level. As such, spectrum degradation of the RF transmit signal RFT may be greater during the second operating mode than during the first operating mode. In this regard, the compression tolerance criteria may be based on operating using acceptable levels of spectrum degradation of the RF transmit signal RFT. Therefore, in an exemplary embodiment of the RF transmitter circuitry 12, the second operating mode is selected to increase efficiency when the spectrum degradation remains within acceptable limits.

Figure 5:
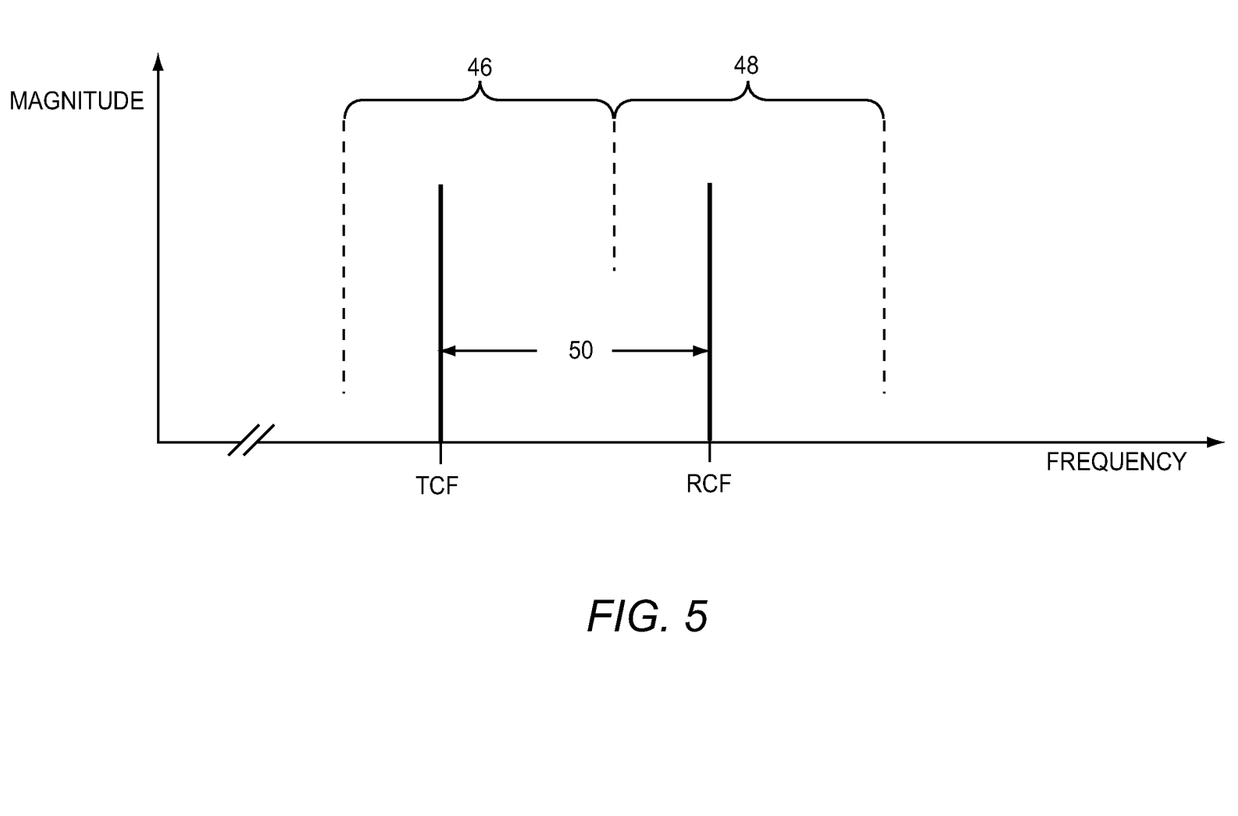
FIG. 5 is a graph illustrating an RF transmit band associated with the RF transmit signal and an RF receive band associated with an RF receive signal illustrated in FIG. 1 according to an alternate embodiment of the RF communications system.

In a first exemplary embodiment of the RF transmitter circuitry 12, the RF front-end circuitry 16 provides the RF receive signal RFR. An RF duplex frequency 50 (FIG. 5) is equal to a difference between an RF carrier frequency of the RF transmit signal RFT and an RF carrier frequency of the RF receive signal RFR. The compression tolerance criteria includes the RF duplex frequency 50 (FIG. 5). The RF duplex frequency 50 (FIG. 5) represents a frequency separation between the RF transmit signal RFT and the RF receive signal RFR. The greater the RF duplex frequency 50 (FIG. 5), the greater the frequency separation between the RF transmit signal RFT and the RF receive signal RFR. Therefore, as the RF duplex frequency 50 (FIG. 5) increases, interference of the RF receive signal RFR from the RF transmit signal RFT tends to decrease. A duplex threshold is a value of the RF duplex frequency 50 (FIG. 5), such that when the RF duplex frequency 50 (FIG. 5) is above the duplex threshold, the second compression level may be used without undue interference of the RF receive signal RFR from the RF transmit signal RFT. In this regard, the first operating mode is selected when the RF duplex frequency 50 (FIG. 5) is less than the duplex threshold and the second operating mode is selected when the RF duplex frequency 50 (FIG. 5) is greater than the duplex threshold.

In a second exemplary embodiment of the RF transmitter circuitry 12, the envelope power supply signal EPS tracks an envelope of the RF input signal RFI. By tracking the envelope of the RF input signal RFI, an efficiency of the RF transmitter circuitry 12 is greater than if the envelope power supply signal EPS was held at a constant magnitude. In this regard, the envelope power supply signal EPS has an envelope power supply signal bandwidth, which corresponds to a bandwidth of the envelope of the RF input signal RFI. As the envelope power supply signal bandwidth increases, the ability of the envelope tracking power supply 26 to track the envelope of the RF input signal RFI may decrease due to shortcomings in the envelope tracking power supply 26. Such shortcomings may be due to switching ripple of the envelope tracking power supply 26; frequency distortion of the envelope tracking power supply 26 due to group delay variations, limited bandwidth of the envelope tracking power supply 26, or both; modulated output current of the RF PA 24 mixing with an output impedance of the envelope tracking power supply 26, or any combination thereof.

In this regard, the compression tolerance criteria includes the envelope power supply signal bandwidth. A bandwidth threshold is a value of the envelope power supply signal bandwidth, such that when the envelope power supply signal bandwidth is less than the bandwidth threshold, the second compression level may be used without causing unacceptable levels of spectrum degradation of the RF transmit signal RFT. In this regard, the first operating mode is selected when the envelope power supply signal bandwidth is greater than the bandwidth threshold and the second operating mode is selected when the envelope power supply signal bandwidth is less than the bandwidth threshold. In a first exemplary embodiment of the bandwidth threshold, the bandwidth threshold is equal to about 5 megahertz. In a second exemplary embodiment of the bandwidth threshold, the bandwidth threshold is equal to about 10 megahertz. In a third exemplary embodiment of the bandwidth threshold, the bandwidth threshold is equal to about 15 megahertz.

In a third exemplary embodiment of the RF transmitter circuitry 12, the compression tolerance criteria includes both the envelope power supply signal bandwidth and the RF duplex frequency 50 (FIG. 5). In this regard, the first operating mode is selected when the envelope power supply signal bandwidth is greater than the bandwidth threshold, the RF duplex frequency 50 (FIG. 5) is less than the duplex threshold, or both, otherwise the second operating mode is selected.

In one embodiment of the RF transmitter circuitry 12, the RF PA 24 operates in one of multiple operating modes. The multiple operating modes include the first operating mode and the second operating mode. During the one of the multiple operating modes, the RF PA 24 receives and amplifies the RF input signal RFI using a corresponding one of multiple compression levels. The multiple compression levels include the first compression level and the second compression level. Selection of the one of the multiple operating modes is based on the compression tolerance criteria.

In one embodiment of the RF communications system 10, the RF system control circuitry 14 selects the one of the first operating mode and the second operating mode. In an alternate embodiment of the RF communications system 10, the RF system control circuitry 14 selects the one of the multiple operating modes. In one embodiment of the RF communications system 10, the RF system control circuitry 14 selects between the first compression level and the second compression level based on adjusting a magnitude of the envelope power supply control signal VRMP. In this regard, the RF system control circuitry 14 may include a look-up table, which is indexed by progressive values of the envelope of the RF input signal RFI. The look-up table may then provide corresponding values of the envelope power supply control signal VRMP that provide the appropriate adjustment to the envelope power supply signal EPS that provides the proper compression level.

In an alternate embodiment of the RF communications system 10, the RF system control circuitry 14 selects between the first compression level and the second compression level based on adjusting a bias of the RF PA 24 via the transmitter configuration signal PACS. In an additional embodiment of the RF communications system 10, the RF system control circuitry 14 selects between the first compression level and the second compression level based on adjusting a bias of the RF PA 24 via the transmitter configuration signal PACS and adjusting the magnitude of the envelope power supply control signal VRMP.

Figure 2:
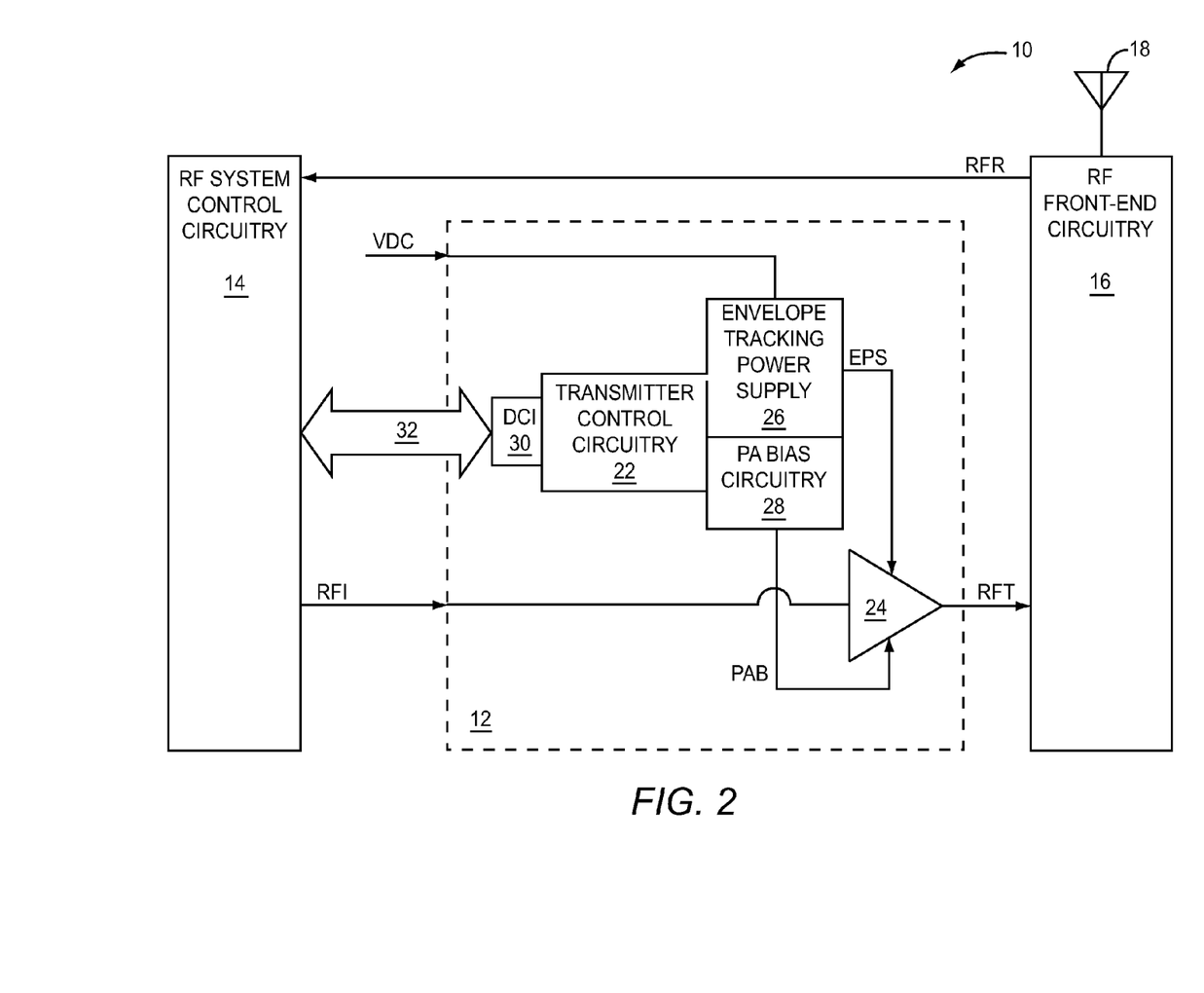
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
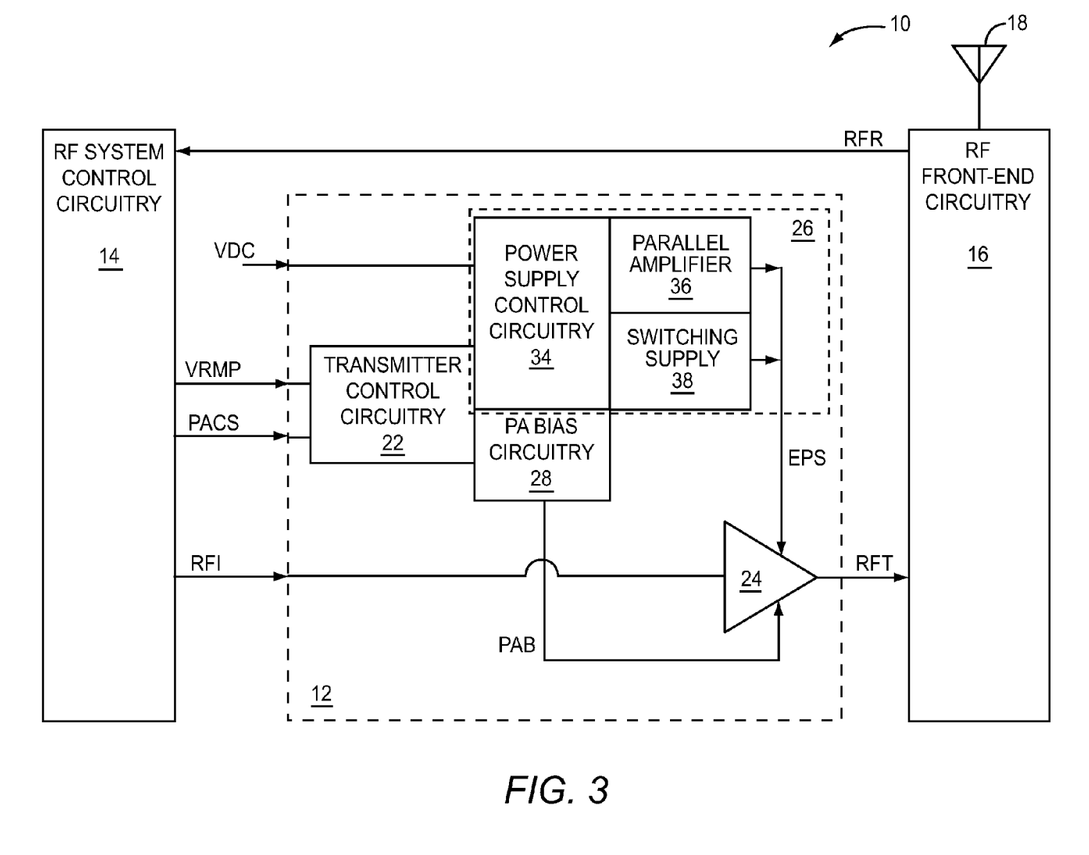
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a parallel amplifier 36, and a switching supply 38. The power supply control circuitry 34 controls the parallel amplifier 36 and the switching supply 38. The parallel amplifier 36 and the switching supply 38 provide the envelope power supply signal EPS. The switching supply 38 may provide power more efficiently than the parallel amplifier 36. However, the parallel amplifier 36 may provide the envelope power supply signal EPS more accurately than the switching supply 38. As such, the parallel amplifier 36 regulates a voltage of the envelope power supply signal EPS based on the setpoint of the envelope power supply signal EPS, and the switching supply 38 operates to drive an output current from the parallel amplifier 36 toward zero to maximize efficiency.

Figure 4:
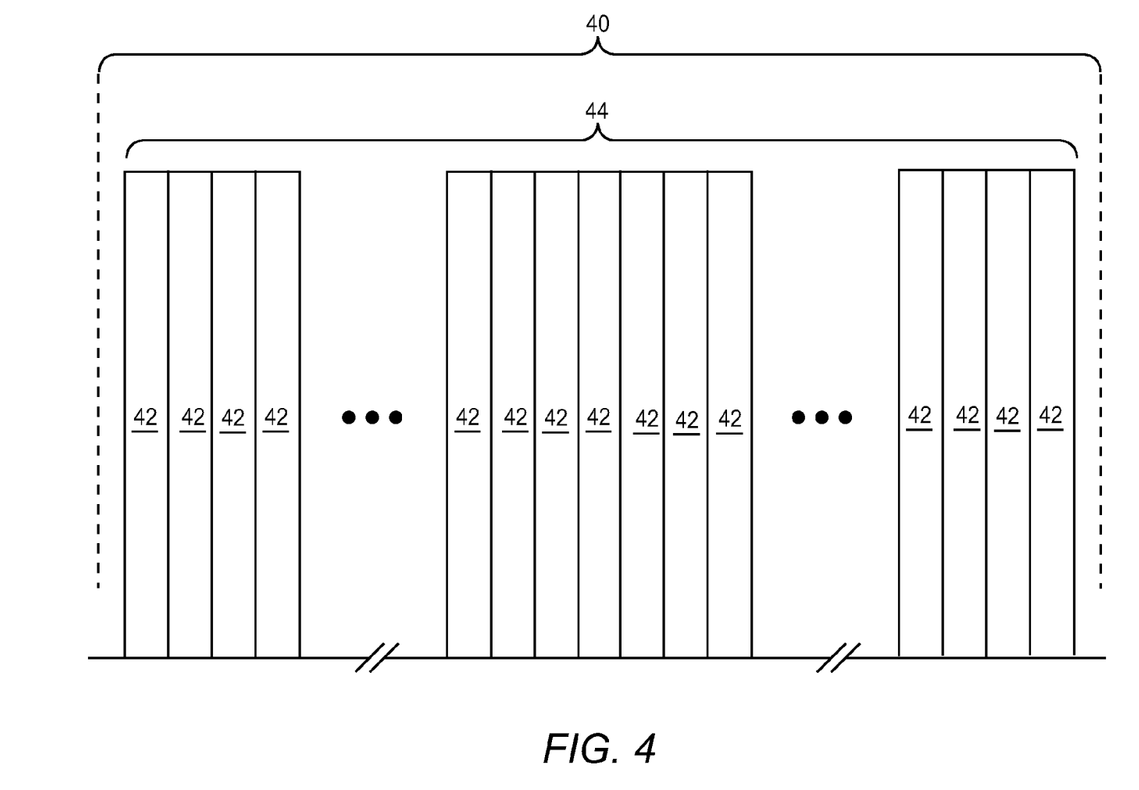
FIG. 4 is a graph illustrating a transmission channel of an RF transmit signal illustrated in FIG. 1 according to one embodiment of the RF communications system.

FIG. 4 is a graph illustrating a transmission channel of the RF transmit signal RFT illustrated in FIG. 1 according to one embodiment of the RF communications system 10. The transmission channel illustrated in FIG. 1 may be associated with a Long Term Evolution (LTE) communications protocol. The transmission channel has a transmission channel bandwidth 40. Multiple resource blocks 42 divide a maximum transmission bandwidth 44 of the transmission channel into equal portions. As such, when transmitting data that does not require the maximum transmission bandwidth 44, a portion of the resource blocks 42 may be inactive. Therefore, only the contiguous resource blocks 42 that are needed to provide required transmission bandwidth are active. In this regard, the bandwidth of the envelope of the RF transmit signal RFT (FIG. 1), the bandwidth of the envelope of the RF input signal RFI (FIG. 1), and the envelope power supply signal bandwidth may be determined by identifying the active resource blocks 42.

FIG. 5 is a graph illustrating an RF transmit band 46 associated with the RF transmit signal RFT and an RF receive band 48 associated with the RF receive signal RFR illustrated in FIG. 1 according to an alternate embodiment of the RF communications system 10. The RF transmit signal RFT (FIG. 1) has a transmit carrier frequency TCF and the RF receive signal RFR (FIG. 1) has a receive carrier frequency RCF. The RF duplex frequency 50 is based on a difference between the transmit carrier frequency TCF and the receive carrier frequency RCF.

Figure 6:
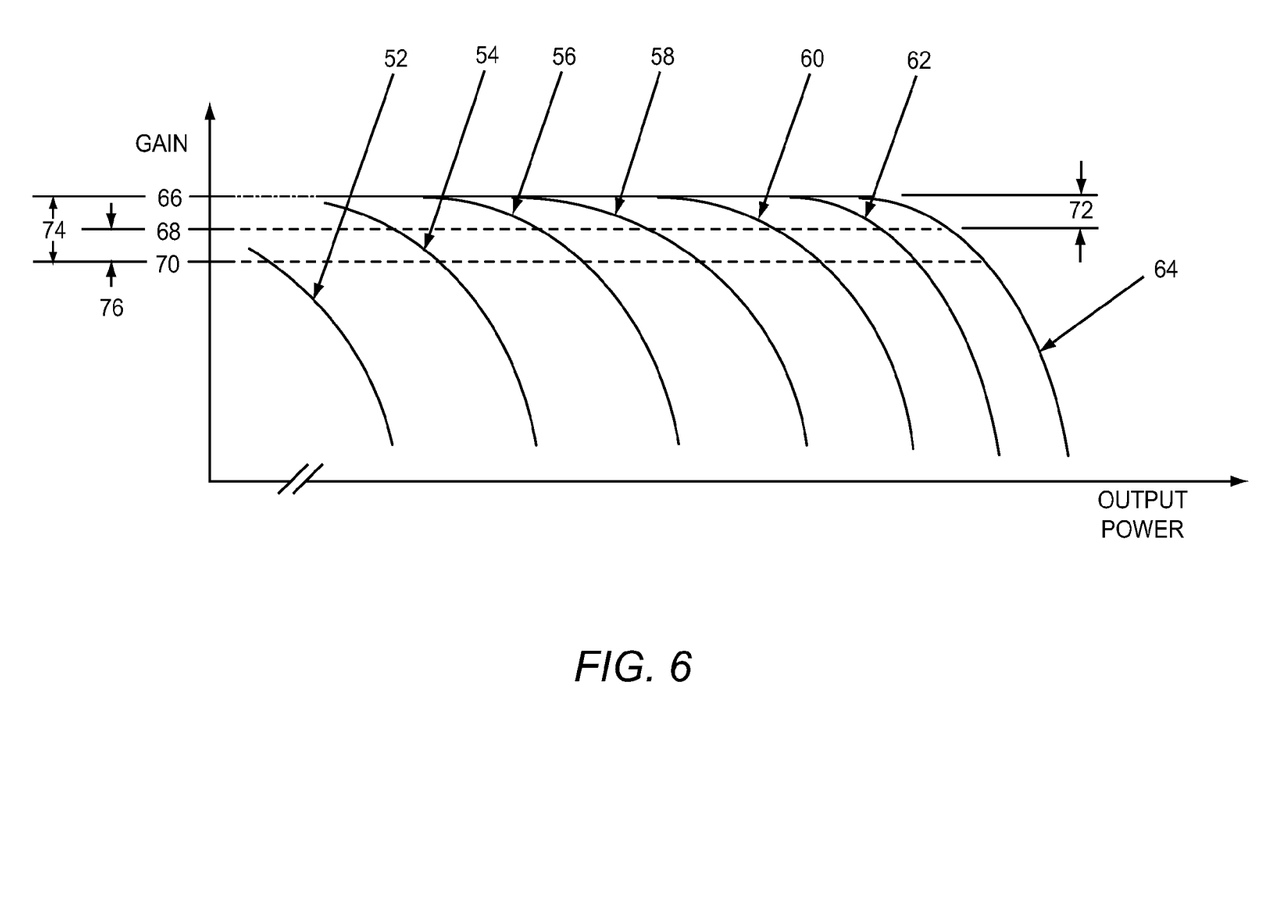
FIG. 6 is a graph illustrating different gain curves of an RF PA illustrated in FIG. 1 according to one embodiment of the RF PA.

FIG. 6 is a graph illustrating different gain curves of the RF PA 24 illustrated in FIG. 1 according to one embodiment of the RF PA 24. Each gain curve illustrates gain of the RF PA 24 (FIG. 1) versus output power from the RF PA 24 (FIG. 1) at a specific magnitude of the envelope power supply signal EPS (FIG. 1). A first gain curve 52 of the RF PA 24 shows the gain of the RF PA 24 (FIG. 1) versus output power from the RF PA 24 (FIG. 1) at a first magnitude of the envelope power supply signal EPS (FIG. 1). A second gain curve 54 of the RF PA 24 shows the gain of the RF PA 24 (FIG. 1) versus output power from the RF PA 24 (FIG. 1) at a second magnitude of the envelope power supply signal EPS (FIG. 1). A third gain curve 56 of the RF PA 24 shows the gain of the RF PA 24 (FIG. 1) versus output power from the RF PA 24 (FIG. 1) at a third magnitude of the envelope power supply signal EPS (FIG. 1).

A fourth gain curve 58 of the RF PA 24 shows the gain of the RF PA 24 (FIG. 1) versus output power from the RF PA 24 (FIG. 1) at a fourth magnitude of the envelope power supply signal EPS (FIG. 1). A fifth gain curve 60 of the RF PA 24 shows the gain of the RF PA 24 (FIG. 1) versus output power from the RF PA 24 (FIG. 1) at a fifth magnitude of the envelope power supply signal EPS (FIG. 1). A sixth gain curve 62 of the RF PA 24 shows the gain of the RF PA 24 (FIG. 1) versus output power from the RF PA 24 (FIG. 1) at a sixth magnitude of the envelope power supply signal EPS (FIG. 1). A seventh gain curve 64 of the RF PA 24 shows the gain of the RF PA 24 (FIG. 1) versus output power from the RF PA 24 (FIG. 1) at a seventh magnitude of the envelope power supply signal EPS (FIG. 1).

The first magnitude of the envelope power supply signal EPS (FIG. 1) is less than the second magnitude of the envelope power supply signal EPS (FIG. 1). The second magnitude of the envelope power supply signal EPS (FIG. 1) is less than the third magnitude of the envelope power supply signal EPS (FIG. 1). The third magnitude of the envelope power supply signal EPS (FIG. 1) is less than the fourth magnitude of the envelope power supply signal EPS (FIG. 1). The fourth magnitude of the envelope power supply signal EPS (FIG. 1) is less than the fifth magnitude of the envelope power supply signal EPS (FIG. 1). The fifth magnitude of the envelope power supply signal EPS (FIG. 1) is less than the sixth magnitude of the envelope power supply signal EPS (FIG. 1). The sixth magnitude of the envelope power supply signal EPS (FIG. 1) is less than the seventh magnitude of the envelope power supply signal EPS (FIG. 1).

The gain curves 52, 54, 56, 58, 60, 62, 64 illustrate the behavior of the RF PA 24 (FIG. 1) as it operates in increasing levels of compression. At low levels of output power, the RF PA 24 (FIG. 1) has no compression gain 66, such that the RF PA 24 (FIG. 1) is not in compression at all. However, as the output power from the RF PA 24 (FIG. 1) increases, the RF PA 24 (FIG. 1) goes into compression, thereby causing the gain of the RF PA 24 (FIG. 1) to drop. Further, increasing the output power from the RF PA 24 (FIG. 1) further increases the compression level of the RF PA 24 (FIG. 1), thereby causing further drop in gain of the RF PA 24 (FIG. 1). As the magnitude of the envelope power supply signal EPS (FIG. 1) increases, the level of output power from the RF PA 24 (FIG. 1) that forces the RF PA 24 (FIG. 1) into compression increases. As such, within certain operating limits, for a given output power from the RF PA 24 (FIG. 1), the compression level of the RF PA 24 (FIG. 1) can be controlled by varying the magnitude of the envelope power supply signal EPS (FIG. 1). In one embodiment of the RF communications system 10 (FIG. 1), the magnitude of the envelope power supply signal EPS (FIG. 1) is varied as the envelope of the output power from the RF PA 24 (FIG. 1) changes to regulate the gain of the RF PA 24 (FIG. 1) to be about constant. This regulated constant gain is called iso-gain.

FIG. 6 shows a first iso-gain 68 at one compression level and a second iso-gain 70 at another compression level. A first gain difference 72 is a difference between the no compression gain 66 and the first iso-gain 68. A second gain difference 74 is a difference between the no compression gain 66 and the second iso-gain 70. A third gain difference 76 is a difference between the first iso-gain 68 and the second iso-gain 70. In one embodiment of the RF PA 24 (FIG. 1), the efficiency of the RF PA 24 (FIG. 1) is greater at the first iso-gain 68 than at the no compression gain 66. In an alternate embodiment of the RF PA 24 (FIG. 1), the efficiency of the RF PA 24 (FIG. 1) is greater at the second iso-gain 70 than at the first iso-gain 68. In an additional embodiment of the RF PA 24 (FIG. 1), the efficiency of the RF PA 24 (FIG. 1) is greater at the second iso-gain 70 than at the no compression gain 66.

In one embodiment of the RF PA 24 (FIG. 1), during the first operating mode, the RF PA 24 (FIG. 1) has the no compression gain 66 and during the second operating mode, the RF PA 24 (FIG. 1) has the first iso-gain 68. In a first embodiment of the first iso-gain 68, the first iso-gain 68 is equal to about 28.5 dB. In a second embodiment of the first iso-gain 68, the first iso-gain 68 is equal to about 28.0 dB. In a third embodiment of the first iso-gain 68, the first iso-gain 68 is equal to about 27.5 dB. In a fourth embodiment of the first iso-gain 68, the first iso-gain 68 is equal to about 27.0 dB. In a fifth embodiment of the first iso-gain 68, the first iso-gain 68 is equal to about 26.5 dB. In a sixth embodiment of the first iso-gain 68, the first iso-gain 68 is equal to about 26.0 dB. In a seventh embodiment of the first iso-gain 68, the first iso-gain 68 is equal to about 25.5 dB. In an eighth embodiment of the first iso-gain 68, the first iso-gain 68 is equal to about 25.0 dB.

In an alternate embodiment of the RF PA 24 (FIG. 1), during the first operating mode, the RF PA 24 (FIG. 1) has the first iso-gain 68 and during the second operating mode, the RF PA 24 (FIG. 1) has the second iso-gain 70. In a first embodiment of the second iso-gain 70, the second iso-gain 70 is equal to about 28.5 dB. In a second embodiment of the second iso-gain 70, the second iso-gain 70 is equal to about 28.0 dB. In a third embodiment of the second iso-gain 70, the second iso-gain 70 is equal to about 27.5 dB. In a fourth embodiment of the second iso-gain 70, the second iso-gain 70 is equal to about 27.0 dB. In a fifth embodiment of the second iso-gain 70, the second iso-gain 70 is equal to about 26.5 dB. In a sixth embodiment of the second iso-gain 70, the second iso-gain 70 is equal to about 26.0 dB. In a seventh embodiment of the second iso-gain 70, the second iso-gain 70 is equal to about 25.5 dB. In an eighth embodiment of the second iso-gain 70, the second iso-gain 70 is equal to about 25.0 dB. In a first embodiment of the third gain difference 76, the third gain difference 76 is equal to about 0.5 dB. In a second embodiment of the third gain difference 76, the third gain difference 76 is equal to about 1.0 dB. In a third embodiment of the third gain difference 76, the third gain difference 76 is equal to about 1.5 dB. In a fourth embodiment of the third gain difference 76, the third gain difference 76 is equal to about 2.0 dB. In a fifth embodiment of the third gain difference 76, the third gain difference 76 is equal to about 2.5 dB.

In one embodiment of the RF PA 24 (FIG. 1), during the first operating mode, the RF PA 24 (FIG. 1) has the no compression gain 66 and during the second operating mode, the RF PA 24 (FIG. 1) has the first iso-gain 68. As such, the first compression level correlates with the no compression gain 66 and the second compression level correlates with the first iso-gain 68. In this regard, a difference between the first compression level and the second compression level is about equal to the first gain difference 72. In an alternate embodiment of the RF PA 24 (FIG. 1), during the first operating mode, the RF PA 24 (FIG. 1) has the first iso-gain 68 and during the second operating mode, the RF PA 24 (FIG. 1) has the second iso-gain 70. As such, the first compression level correlates with the first iso-gain 68 and the second compression level correlates with the second iso-gain 70. In this regard, a difference between the first compression level and the second compression level is about equal to the third gain difference 76.

In one embodiment of the RF PA 24 (FIG. 1), the second compression level is at least 0.5 dB greater than the first compression level. In an alternate embodiment of the RF PA 24 (FIG. 1), the second compression level is at least 1.0 dB greater than the first compression level. In an additional embodiment of the RF PA 24 (FIG. 1), the second compression level is at least 1.5 dB greater than the first compression level. In another embodiment of the RF PA 24 (FIG. 1), the second compression level is at least 2.0 dB greater than the first compression level. In a further embodiment of the RF PA 24 (FIG. 1), the second compression level is at least 2.5 dB greater than the first compression level.

In a first embodiment of the first compression level, the first compression level is equal to about 0 dB. In a second embodiment of the first compression level, the first compression level is equal to about 0.5 dB. In a third embodiment of the first compression level, the first compression level is equal to about 1.0 dB. In a fourth embodiment of the first compression level, the first compression level is equal to about 1.5 dB. In a fifth embodiment of the first compression level, the first compression level is equal to about 2.0 dB. In a first embodiment of the second compression level, the second compression level is equal to about 0.5 dB. In a second embodiment of the second compression level, the second compression level is equal to about 1.0 dB. In a third embodiment of the second compression level, the second compression level is equal to about 1.5 dB. In a fourth embodiment of the second compression level, the second compression level is equal to about 2.0 dB. In a fifth embodiment of the second compression level, the second compression level is equal to about 2.5 dB. In a sixth embodiment of the second compression level, the second compression level is equal to about 3.0 dB.

Those skilled in the art will recognize improvements and modifications to the embodiments of the present disclosure. All such improvements and modifications are considered within the scope of the concepts disclosed herein and the claims that follow.

What is claimed is:

1. Circuitry comprising control circuitry adapted to select one of a first operating mode and a second operating mode, such that:
   an envelope tracking power supply is adapted to provide an envelope power supply signal to a radio frequency (RF) power amplifier (PA); and
   the RF PA is adapted to:
      operate in the one of the first operating mode and the second operating mode, such that selection of the one of the first operating mode and the second operating mode is based on compression tolerance criteria;
      during the first operating mode, receive and amplify an RF input signal using a first compression level; and
      during the second operating mode, receive and amplify the RF input signal using a second compression level, which is greater than the first compression level,
   wherein the envelope power supply signal provides power for amplification.

2. The circuitry of claim 1 wherein an efficiency of the RF PA is greater during the second operating mode than during the first operating mode.

3. The circuitry of claim 1 wherein:
   the RF PA is further adapted to provide an RF transmit signal based on receiving and amplifying the RF input signal using the envelope power supply signal; and
   a spectrum degradation of the RF transmit signal is greater during the second operating mode than during the first operating mode.

4. The circuitry of claim 1 further comprising the envelope tracking power supply and the RF PA.

5. The circuitry of claim 1 wherein RF transceiver circuitry comprises the control circuitry.

6. The circuitry of claim 1 wherein:
   the control circuitry is further adapted to provide an envelope power supply control signal; and
   the envelope tracking power supply is further adapted to provide the envelope power supply signal based on the envelope power supply control signal.

7. The circuitry of claim 6 wherein selection between the first compression level and the second compression level is based on adjusting a magnitude of the envelope power supply control signal.

8. The circuitry of claim 1 wherein selection between the first compression level and the second compression level is based on adjusting a magnitude of the envelope power supply signal.

9. The circuitry of claim 1 wherein selection between the first compression level and the second compression level is based on adjusting a magnitude of the envelope power supply signal and adjusting a bias of the RF PA.

10. The circuitry of claim 1 wherein selection between the first compression level and the second compression level is based on adjusting a bias of the RF PA.

11. The circuitry of claim 1 wherein:
the RF PA is further adapted to provide an RF transmit signal based on receiving and amplifying the RF input signal;
an RF duplex frequency is equal to a difference between an RF carrier frequency of the RF transmit signal and an RF carrier frequency of an RF receive signal; and
the compression tolerance criteria comprises the RF duplex frequency.

12. The circuitry of claim 11 wherein RF front-end circuitry is adapted to provide the RF receive signal, and receive, process, and transmit the RF transmit signal.

13. The circuitry of claim 11 wherein the control circuitry is further adapted to:
select the first operating mode when the RF duplex frequency is less than a duplex threshold; and
select the second operating mode when the RF duplex frequency is greater than the duplex threshold.

14. The circuitry of claim 11 wherein:
the envelope power supply signal has an envelope power supply signal bandwidth; and
the compression tolerance criteria further comprises the envelope power supply signal bandwidth.

15. The circuitry of claim 1 wherein:
the envelope power supply signal has an envelope power supply signal bandwidth; and
the compression tolerance criteria comprises the envelope power supply signal bandwidth.

16. The circuitry of claim 15 wherein the control circuitry is further adapted to:
select the first operating mode when the envelope power supply signal bandwidth is greater than a bandwidth threshold; and
select the second operating mode when the envelope power supply signal bandwidth is less than the bandwidth threshold.

17. The circuitry of claim 16 wherein the bandwidth threshold is equal to about 5 megahertz.

18. The circuitry of claim 16 wherein the bandwidth threshold is equal to about 10 megahertz.

19. The circuitry of claim 1 wherein the second compression level is at least one-half decibel (dB) greater than the first compression level.

20. The circuitry of claim 19 wherein the second compression level is equal to about 1 dB and the first compression level is equal to about 0 dB.

21. The circuitry of claim 1 wherein the RF PA is further adapted to operate in one of a plurality of operating modes, such that:
the plurality of operating modes comprises the first operating mode and the second operating mode;
during the one of the plurality of operating modes, the RF PA is further adapted to receive and amplify the RF input signal using a corresponding one of a plurality of compression levels;
the plurality of compression levels comprises the first compression level and the second compression level; and
selection of the one of the plurality of operating modes is based on the compression tolerance criteria.

22. Circuitry comprising:
an envelope tracking power supply adapted to provide an envelope power supply signal to a radio frequency (RF) power amplifier (PA); and
the RF PA adapted to:
operate in one of a first operating mode and a second operating mode, such that selection of the one of the first operating mode and the second operating mode is based on compression tolerance criteria;
during the first operating mode, receive and amplify an RF input signal using a first compression level; and
during the second operating mode, receive and amplify the RF input signal using a second compression level, which is greater than the first compression level,
wherein the envelope power supply signal provides power for amplification.

23. A method comprising:
selecting one of a first operating mode and a second operating mode;
providing an envelope power supply signal, which provides power for amplification;
operating in the one of the first operating mode and the second operating mode, such that selection of the one of the first operating mode and the second operating mode is based on compression tolerance criteria;
during the first operating mode, receiving and amplifying a radio frequency (RF) input signal using a first compression level; and
during the second operating mode, receiving and amplifying the RF input signal using a second compression level, which is greater than the first compression level.

24. The method of claim 23 further comprising providing an RF transmit signal based on receiving and amplifying the RF input signal, wherein:
an RF duplex frequency is equal to a difference between an RF carrier frequency of the RF transmit signal and an RF carrier frequency of an RF receive signal; and
the compression tolerance criteria comprises the RF duplex frequency.

25. The method of claim 23 wherein:
the envelope power supply signal has an envelope power supply signal bandwidth; and
the compression tolerance criteria comprises the envelope power supply signal bandwidth.

* * * * *